United States Patent [19]

Masuda et al.

[11] Patent Number: 4,553,215

[45] Date of Patent: Nov. 12, 1985

[54] GRAVURE SCREEN AND METHOD OF MAKING THE SAME

[75] Inventors: Toshiro Masuda, Tokyo; Yoichi Tanaka, Hachioji, both of Japan

[73] Assignee: Toppan Printing Co., Ltd., Japan

[21] Appl. No.: 296,179

[22] Filed: Aug. 25, 1981

[30] Foreign Application Priority Data

Jan. 22, 1981 [JP] Japan .................................. 56-8212

[51] Int. Cl.[4] .......................... G06F 15/20; G03F 5/00
[52] U.S. Cl. .................................... 364/525; 364/520; 382/47; 430/307
[58] Field of Search .................. 101/128.4, 170, 401.1; 156/660, 905; 430/275, 281, 300, 307, 296, 297, 310, 322; 364/525, 518–520, 523; 356/237; 250/563; 358/283, 903; 350/322; 382/50, 44, 47

[56] References Cited

U.S. PATENT DOCUMENTS

| | | | |
|---|---|---|---|
| 3,391,392 | 7/1968 | Doyle | 364/520 X |
| 3,636,328 | 1/1972 | Korelitz et al. | 364/520 X |
| 4,003,311 | 1/1977 | Bardin | 101/401.1 |
| 4,012,257 | 3/1977 | Geris | 430/307 |
| 4,158,567 | 6/1979 | Honma et al. | 430/307 |
| 4,283,471 | 8/1981 | Sportelli | 430/307 |
| 4,339,774 | 7/1982 | Temple | 358/903 |
| 4,381,547 | 4/1983 | Ejiri | 382/47 |

*Primary Examiner*—Gary Chin
*Assistant Examiner*—Kevin J. Teska
*Attorney, Agent, or Firm*—Lerner, David, Littenberg, Krumholz & Mentlik

[57] ABSTRACT

The present invention relates to a gravure screen and method of making the same and particularly to a gravure screen and method of making the same in which in the case that a gravure printing plate is made using a planographic or relief half-tone positive, the gravure screen is combined with the half-tone positive.

Transparent or opaque lines of the gravure screen in accordance with the present invention are formed by irregular patterns, and the presence of this irregularity does not cause to form a moire pattern even if the gravure screen is combined with the planographic or relief half-tone positive formed by regularly aligned dot patterns.

It is therefore possible to combine the gravure screen of the present invention with a half-tone positive of any screen angle, and a gravure printing plate can be made by only one gravure screen even in a plurality of half-tone positives having different angles.

In addition, the gravure screen of the present invention can be used in the conventional gravure process, and even if a design having regular patterns is present in an original, the moire does not occur between the design and the gravure screen.

3 Claims, 34 Drawing Figures

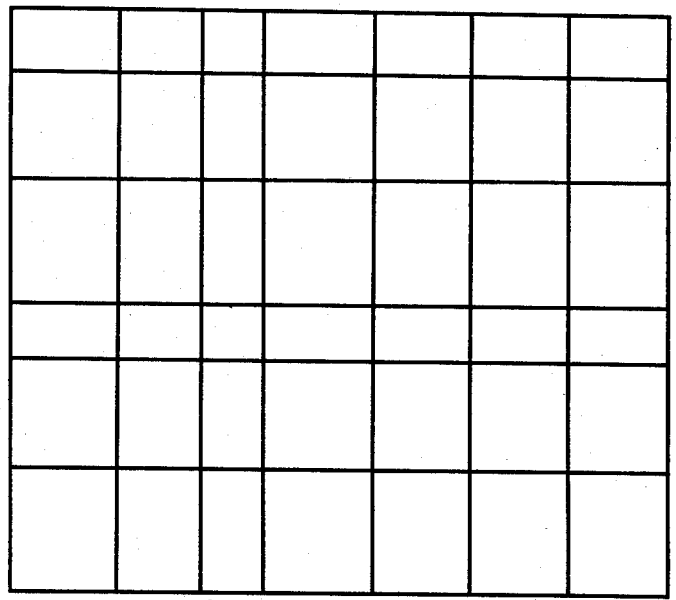
F I G. 7
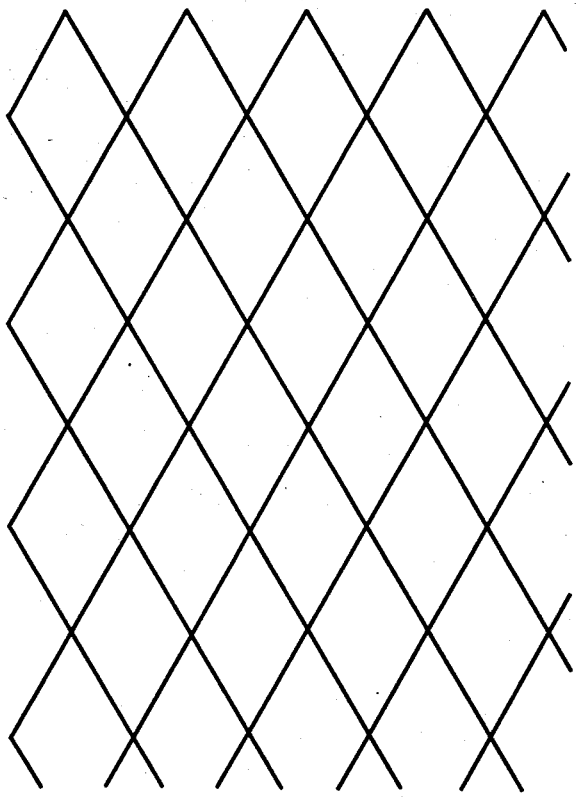
F I G. 8

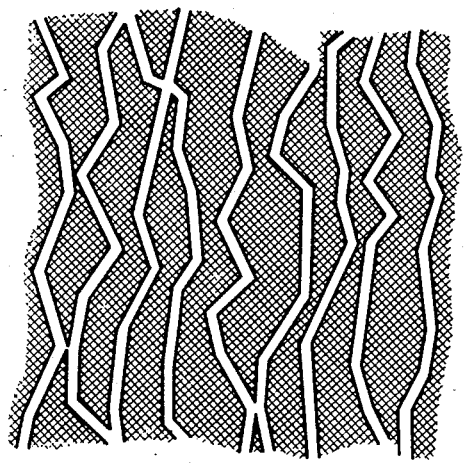
FIG.15
FIG.16
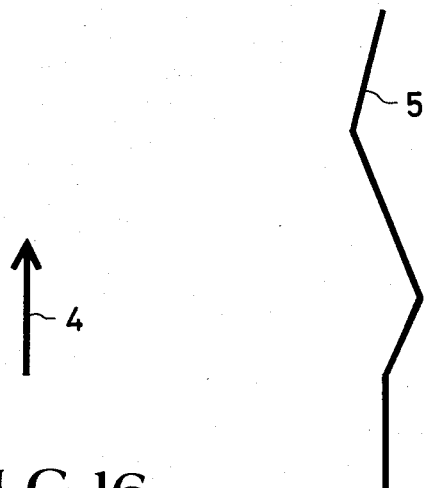
FIG.17

GRAVURE SCREEN AND METHOD OF MAKING THE SAME

BACKGROUND OF THE INVENTION

In order to carry out gravure printing, it is generally necessary to provide so-called banks adapted to form independent fine recesses for holding ink on the surface of the gravure printing plate. It is well known that the banks adapted to form such fine recesses are formed by the use of the gravure screen. In general, the gravure screen has a number of independent opaque fine dots regularly aligned. If such a gravure screen is used to perform printing of more than two colors, the moire is liable to occur.

Also, there has recently been proposed a method for performing the gravure printing by use of a planographic or relief half-tone positive.

In a planographic or relief half-tone positive, the opaque dots are independent in the light portion to the middle tone portion but these dots are in contact with each other or superposed one above the other in the middle tone portion to the shadow portion.

Accordingly, in the case that the planographic or relief half-tone positive is used to make a gravure printing plate, the gravure screen is combined and used to prevent the flow of ink even in the middle tone portion to the shadow portion. Even in such a process as described, the moire sometimes occurs between the half-tone positive and the gravure screen.

It is known that the moire between the half-tone positive and the gravure screen is based on the interaction between the regular alignment of the dots of the half-tone positive and the regular alignment of the patterns of the gravure screen.

On the other hand, in the case of multi-color printing, a plurality of half-tone positives corresponding to various colors are necessary, and the aligning angles of the dots of these half-tone positives are different from each other. The reason is to avoid the formation of the moire between the half-tone positives, and thus the aligning angles of the dots of the half-tone positives are selected in such a manner that the moire is most imperceptible.

In general for foregoing reason, to render most imperceptible the moire pattern between the half-tone positive and the gravure screen in the case of multi-color printing, the gravure screen of the screen angle adapted itself to the aligning angle of the dots of the half-tone positive (the screen angle of the half-tone positive) is combined with the respective half-tone positive. Therefore, in the case of the multi-color printing, gravure screens in the number corresponding to the number of colors to be printed are prepared, or a gravure screen having a greater size than the exposure area actually required is used, the gravure screen being rotated so as to have a screen angle suitable for the respective half-tone positive. In the case of the former, there is a disadvantage in that a plurality of expensive gravure screens are necessary, and in the case of the latter, there is a disadvantage in that a gravure screen greater than the required exposure area is necessary.

Accordingly, the development of the gravure screen having no disadvantage as noted above has been expected.

Furthermore, where the design having regular patterns is present in an original even in the conventional gravure process, the moire sometimes occurs between the design and the gravure screen. Thus, the development of the gravure screen which forms no moire pattern as noted above has also been expected.

BRIEF DESCRIPTION OF THE PRIOR ART

In the past, various methods have been proposed to prevent the formation of moire patterns between a half-tone positive and a gravure screen. For example, the U.S. Pat. No. 4,158,567 specification discloses a method in which a gravure screen is not formed in the light portion to the middle tone portion. In this method, however, when the gravure screen is exposed a negative is necessary, and in addition, when the half-tone positive is printed, the half-tone positive must be registered with said negative.

Further, the method of using a sand-grained screen in place of the gravure screen is also disclosed in U.S. Pat. No. 2,096,794. However, this sand-grained screen suffers from disadvantages in that it normally has a coarseness of approximately 100 l/inch which causes an inconveniently rough feel during actual use and individual cells have a great difference in their area, which is liable to produce unevenness.

Moreover, a gravure screen is disclosed in British Pat. No. 974,884 specification to prevent the formation of the moire pattern possibly formed between a half-tone positive and a gravure screen. It seems that if the gravure screen disclosed in said British patent is used, the formation of the moire pattern can be prevented and the individual cells have no great difference in their area. However, the pattern of this screen comprises the repetition of patterns per unit. Further, it is necessary for the transparent lines of the gravure screen disclosed in said British patent to have plural kinds of angles including all the screen angles of a plurality of half-tone positives used. Thus, in the case that the screen angle of the half-tone positive is predetermined, this gravure screen is useful, but in the case where half-tone positives having different screen angles have to be used, the other gravure screen including an angle suitable for the half-tone positive must be used.

BRIEF DESCRIPTION OF THE DRAWINGS

FIG. 7 is an illustration of a pattern in which two sets of a group of straight lines having a number of straight lines aligned parallel to one another and in irregularly spaced relation are intercrossed orthogonal to one another.

FIG. 8 is an illustration of a pattern in which two sets of a group of straight lines having a number of straight lines aligned parallel to one another and in equally spaced relation are diagonally intercrossed.

FIG. 15 is a view for explanation of the actual gravure screen based on the pattern of FIG. 13.

FIG. 16 is an illustration of a starting line vector.

FIG. 17 is an illustration of a pattern of a segment of a line bended irregularly with a number of movable vectors made to continue.

DETAILED DESCRIPTION OF THE INVENTION

The present invention provides a new gravure screen which is entirely different from the aforementioned known gravure screen, as a gravure screen which can prevent the formation of moire pattern.

Generally speaking, the known gravure screens so far are of the negative type and the positive type.

The positive type gravure screen comprises continuous segments of transparent lines and opaque portions surrounded by the segments of transparent lines, and the negative type gravure screen comprises continuous segments of opaque lines and transparent portions surrounded by the segments of opaque lines.

The present invention may provide a gravure screen of either positive or negative type as described.

Generally, in the gravure screen, transparent portions and opaque portions are formed on a substrate such as glass plate or a plastic film. For the substrate for the gravure screen of the present invention, the substrate as described above is suitably selected for use.

Figure 1:
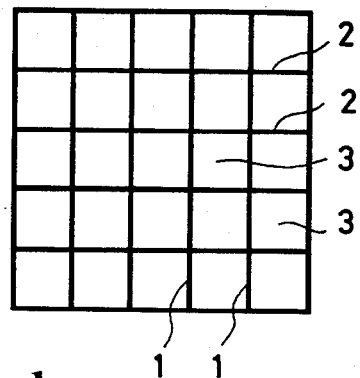
FIG. 1 is an illustration of a pattern of segments of transparent or opaque lines for a conventional gravure screen.

The most general gravure screen heretofore used has a pattern in which as shown in FIG. 1, a number of segments of longitudinal transparent or opaque lines (1) and a number of segments of lateral transparent or opaque lines (2) are intercrossed. In the case of the positive type gravure screen, the longitudinal and lateral segments of the lines in FIG. 1 are transparent and the dot of the cell portion (3) therebetween is opaque. In the case of the negative type gravure screen, the relationship between the transparency and the opaqueness is reversed.

The gravure screen in accordance with the present invention has a totally irregular pattern instead of the regular pattern as mentioned above.

That is, in the gravure screen of the present invention which includes a number of segments of transparent or opaque lines provided on the substrate, those other than the aforementioned segments of lines being opaque or transparent, the above-mentioned number of the segments of transparent or opaque lines comprise irregularly bended straight lines and/or irregularly curved smooth curved lines. The above-mentioned irregularly bended straight lines or irregularly curved smooth curved lines in the present invention are ones in which a number of segments of lines having the desired length are joined by the provision of a spacing or without provision of a spacing.

In accordance with the gravure screen of the present invention as described above, good printed matter may be provided without the formation of moire patterns.

In the gravure screen of the present invention, the above-described number of the segments of transparent or opaque lines provided on the substrate have intersections or branched points formed by said segments of lines in one case, and have no said intersections or branched points in the other case.

Further, in the gravure screen of the present invention, the above-described number of the segments of transparent or opaque lines provided on the substrate are sometimes intercrossed with the other segments of lines to form a number of opaque or transparent irregularly shaped dots surrounded by said segments of lines.

In this case, if the above-described segments of transparent or opaque lines are irregularly bended straight lines, a number of opaque or transparent dots surrounded by said segments of lines assume an irregularly shaped polygon.

In accordance with the present invention as described above, there is also provided a new method for making a gravure screen as mentioned above. That is, the method for making a gravure screen in accordance with the present invention comprises recording positional information of a plurality of points on the basis of the positional information of said plurality of points using positions of said plurality of points as original dots to irregularly displace said plurality of dots within the range to which the desired restriction is applied about said original dots to record their positional information, preparing a number of segments of lines by joining the positions after displacement with straight lines or curved lines on the basis of the positional information after displacement, and using said segments of lines or segments of lines in which said segments of lines are approximated by smooth curved lines, as an original pattern for the gravure screen.

In this case, the width of the segments of lines used as the original pattern is suitably varied so that the width of the segments of transparent or opaque lines of the gravure screen may be varied.

According to one of the embodiments of a method for making a gravure screen in accordance with the present invention, the positions of a plurality of points prior to said displacement are predetermined, the joining relation of the plurality of points is also predetermined, and the joining of the positions after said displacement is carried out in correspondence to the joining relation of the points prior to said displacement.

In this case, the positions of a plurality of points prior to said displacement are the positions at the respective intersections of segments of lines for forming repetitive patterns of a number of regular polygons, and said joining relation of the plurality of points can be placed in correspondence to each side of said regular polygon.

The aforementioned regular polygon can be in the form of a regular triangle, a regular quadrilateral or a regular hexagon.

According to a further example of the embodiment, the positions of a plurality of points prior to said displacement are the positions of intersections in which two sets of a group of straight lines having a number of straight lines aligned in parallel are intercrossed orthogonal to or diagonally to one another, and said joining relation of the plurality of dots can be placed in correspondence to straight lines passing through said intersections.

According to another example of the embodiment, the positions of a plurality of points prior to said displacement are the positions of intersections in which three sets of a group of straight lines having a number of straight lines aligned in parallel are intercrossed orthogonal to or diagonally to one another, and said joining relation of the plurality of points can be placed in correspondence to straight lines passing through said intersections.

According to still another embodiment of the invention, the method comprises setting a predetermined starting line vector, producing a number of movable vectors which are irregularly varied in their length and direction within a predetermined range with respect to said starting line vector, recording a terminal point of said starting line vector as positional information of a first point, using the terminal point of said starting line vector as a starting point of a first movable vector, recording a terminal point of the first movable vector as positional information after displacement of the first point, recording said point as positional information of a second point, using the terminal point of the first movable vector as a starting point of a second movable vector, recording a terminal point of the second movable vector as positional information after displacement of the second point and recording the same as positional information of a third point, recording positional information of a plurality of points prior to movement and positional information after displacement of the plurality of points in a similar manner, joining the positions after displacement of the plurality of points by straight lines or curved lines in accordance with said order to prepare segments of lines, and longitudinally and/or laterally arranging the thus prepared number of segments of lines so that said starting line vector is spaced apart as required to use it as an original pattern of the gravure screen.

Various embodiments as previously mentioned for the gravure screen and method of making the same in accordance with the present invention are taken into consideration.

The present invention will be further described in detail.

According to one embodiment, the gravure screen of the present invention can be prepared on the basis of an arrangement in which cell portions (3) as shown in FIG. 1 are of repetitive patterns of regular quadrilaterals and the cell portions are of repetitive patterns of regular triangles or regular hexagons, or of patterns wherein individual regular polygons are irregularly varied in their shape.

In the following, the gravure screen of the present invention will be described in which the quadrilateral pattern is used. In this case, the positions of a plurality of points prior to displacement are predetermined, the joining relation of the plurality of points is also predetermined, and the joining of the positions after said displacement by straight lines corresponds to the case performed in correspondence to the joining relation of the dots prior to said displacement.

Figure 2:
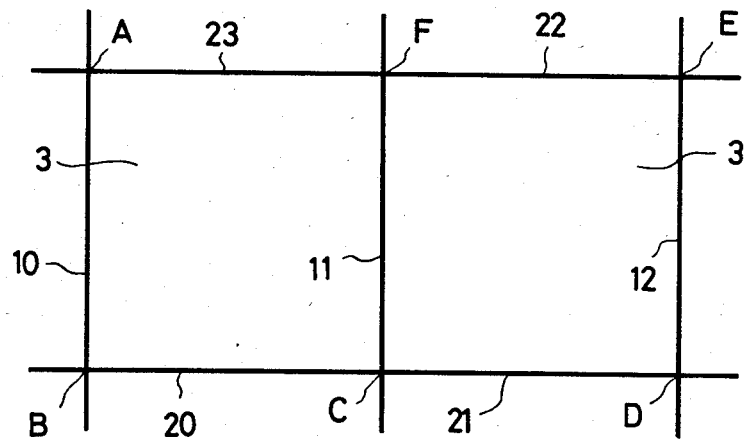
FIG. 2 is a partly enlarged view of the gravure screen shown in FIG. 1.

In the gravure screen of the present invention, positional information of each of intersections of segments of lines for forming repetitive patterns of regular polygons is recorded. FIG. 2 is an enlarged view of a part of FIG. 1, in which case, the aforesaid intersections are indicated as at (A), (B), (C), (D), (E) and (F), respectively.

Next, the irregularity within a predetermined range is provided about the position of the intersection as described to determine and record positions of new points (A'), (B'), (C'), (D'), (E') and (F') corresponding to the respective intersections.

Figure 3:
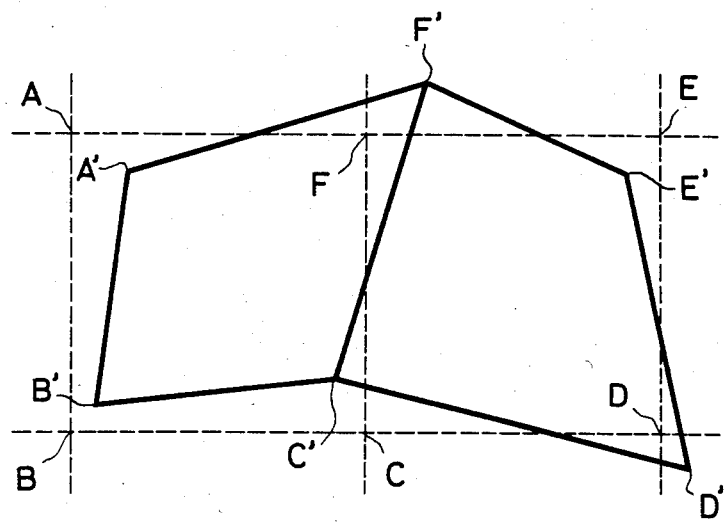
FIG. 3 is an illustration of a modified pattern of the segments of lines in FIG. 2.

The aforementioned new points are connected in correspondence to segments of lines (10), (11), (12), (20), (21), (23) and (23) forming said quadrilateral on the basis of the positional information of said new points to thereby form a modified quadrilateral pattern. FIG. 3 illustrates the thus modified quadrilateral pattern.

In this manner, also in other intersections, the intersections may be moved to form a pattern in which a regular quadrilateral is irregularly deformed.

Figure 4:
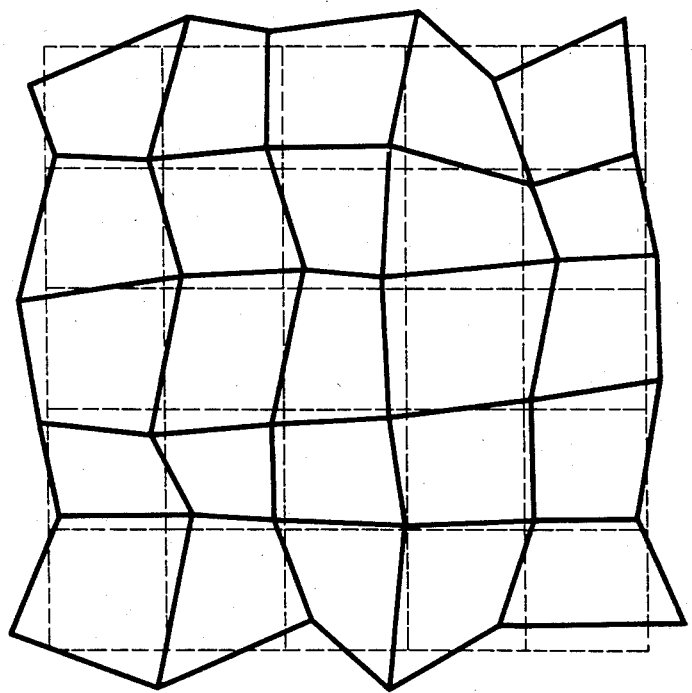
FIG. 4 is an illustration of a quadrilateral pattern in which a position of each intersection of a regular quadrilateral pattern as shown in FIG. 1 is irregularly displaced.

FIG. 4 illustrates a quadrilateral pattern in which positions of the intersections of a regular quadrilateral as shown in FIG. 1 are moved to form an irregularly deformed quadrilateral.

The length of a segment of a line forming each side of the thus deformed quadrilateral is irregularly varied, the irregularity of which depends upon the irregularity when the intersections are moved.

The intersections are moved within a predetermined range. This is based on the requirement that the size of area of a cell is preferred to be as even as possible. To meet such a requirement, means can be employed in which for example, the distance for moving the intersection is such that an average distance of movement is approximately ¼ of the length of one side of a regular polygon, a standard deviation is approximately ⅛ of the length of one side of a regular polygon, and the direction of movement is such that the direction from 0° to 360° around an original intersection is equally taken.

Furthermore, to make the area of the cell uniform, for example, the intersection is made constant relative to the distance of movement $$r = \frac{2 - \sqrt{2}}{2} l$$

(l=Length of one side of a polygon), the direction in which the intersection is moved is the values equally taken from 0°, 15°, 30°, ... 345° in splits of 15°, and the intersections may be moved irregularly within said limitation. In that case, the area of cell after being changed varies by ½ to 2 times the area of the original cell.

Figure 5:
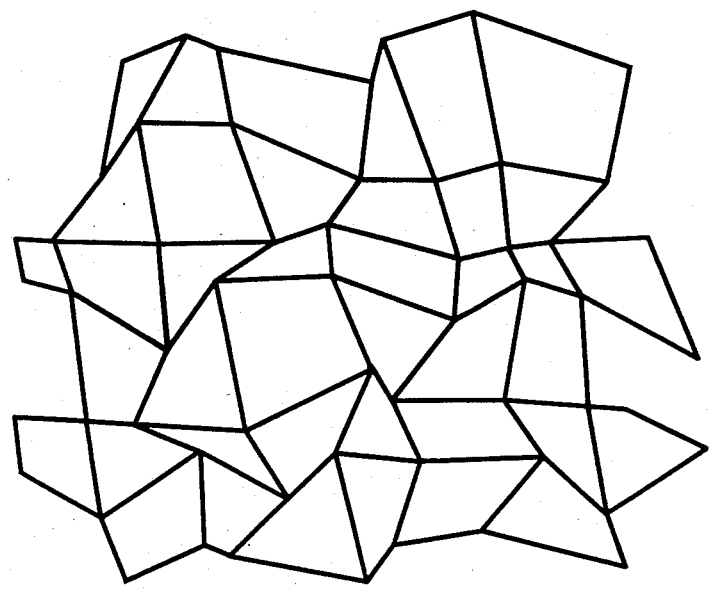
FIG. 5 is an alternative quadrilateral pattern in which a position of each intersection of the regular quadrilateral pattern is irregularly displaced.

FIG. 5 illustrates another example of a quadrilateral pattern irregularly deformed by moving positions of the intersections of a regular quadrilateral in a similar manner or in the preceding embodiment.

The embodiment in the case of FIG. 5 corresponds to one example of a screen pattern in which the distance of movement of each intersection is set to the probability variant so that the maximum value is 0.71 times one side of the original pattern to thereby obtain an area from 0 to 400% relative to the regular quadrilateral area of the original pattern.

While it is preferable in terms of efficiency that the deformed polygonal pattern obtained by moving the positions of the original intersections as described above is prepared by making use of an electronic computer, it is also possible to manually prepare an enlarged pattern, after which it is reduced.

In the present invention, the thus obtained deformed polygonal pattern is used as an orginal pattern having segments of transparent or opaque lines of the gravure screen.

Various means may be used to obtain the gravure screen by making use of the aforementioned original pattern.

For example, it is possible to employ a method which comprises subjecting a deformed polygonal pattern to computation and processing by use of an electronic computer, scribing a transparent glass plate subjected to necessary processing under the control of an automatic engraving machine by use of data resulting from said computation, and preparing a gravure screen in a conventional process.

Alternatively, a deformed polygonal pattern is subjected to computation and processing by use of an electronic computer or the like, and it is then output-formed on a photosensitive film under the control of an exposure device by use of data resulting from said computation to provide a gravure screen.

In a further version, a deformed polygonal pattern is output-formed on a sheet of paper or the like under the control of drafting equipment on the basis of data resulting from the above-mentioned computation, and the resulting output pattern is formed on a transparent film or a glass plate by a photographic procedure or other means to provide a gravure screen.

While in the present invention, an original pattern may be prepared to have the same dimension as a final product, it should be understood that in consideration of the width of lines, accuracy or the like, an original pattern may be enlarged to some extent, after which the pattern is reduced and photographed to provide a gravure screen.

In the case that a memory capacity for obtaining a gravure screen of the size as required increases and as a result loads such as processing time excessively increases, the original pattern may be connected by means such as a multiple exposure. In this case, the position of the intersection at the connection remains unmoved or the intersection may be moved so that the intersection may assume a position in which it can be well connected.

In the present invention, if it is designed so that a portion of the deformed polygonal pattern is transparent whereas other portions are opaque, a positive type gravure screen is obtained, and in contrast with this, a negative type gravure screen is obtained. Whichever gravure screen may be suitably selected as necessary.

The gravure screen of the present invention may be obtained as described above. The dots of the opaque or transparent cell portions form a polygon having the same number of angles, and the lengths of segments of transparent or opaque lines forming a polygon are irregularly varied within a predetermined range.

The gravure screen of the present invention is not limited to the shape of a quadrilateral cell but a triangular cell may be used, which can be prepared in a similar procedure to the case of the shape of the quadrilateral cell. Further, the hexagonal cell may also be manufactured likewise.

The gravure screen of the present invention may also be applied to a rectangle, a diamond and so on other than the repetitive patterns of regular polygons.

To form such a pattern, two sets of a group of straight lines with a number of straight lines aligned in parallel are intercrossed orthogonal to or diagonally to one another.

Figure 6:
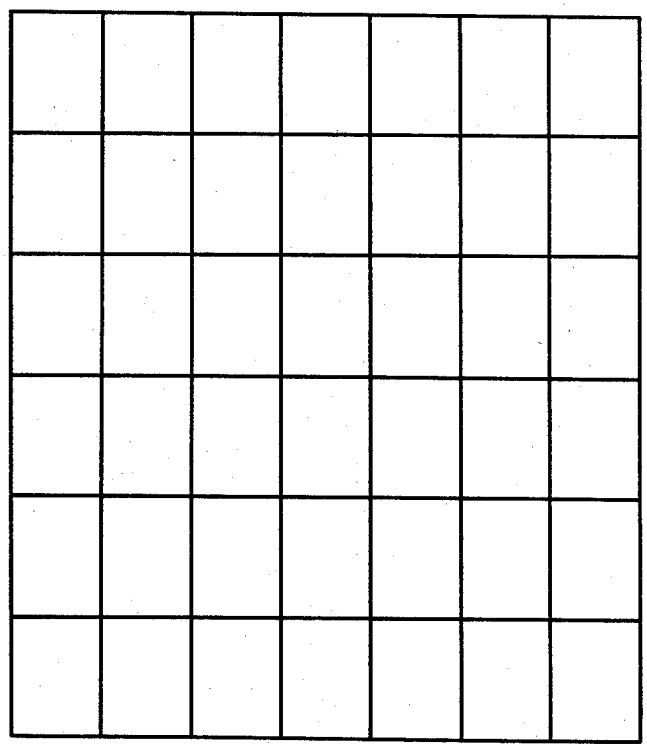
FIG. 6 is an illustration of a pattern in which two sets of a group of straight lines having a number of straight lines aligned parallel to one another and in equally spaced relation are intercrossed orthogonal to one another.

FIGS. 6 to 8 illustrate examples of patterns in which two sets of a group of straight lines are intercrossed orthogonal to or diagonally to one another as described above.

In the patterns shown in FIGS. 6 and 8, a spacing between the straight lines in each group of straight lines is equal. On the other hand, in the pattern shown in FIG. 7, a spacing between the straight lines is unequal.

Furthermore, the gravure screen of the present invention can utilize a pattern in which three sets of a group of straight lines with a number of straight lines aligned in parallel are intercrossed orthogonal to or diagonally to one another.

Figure 9:
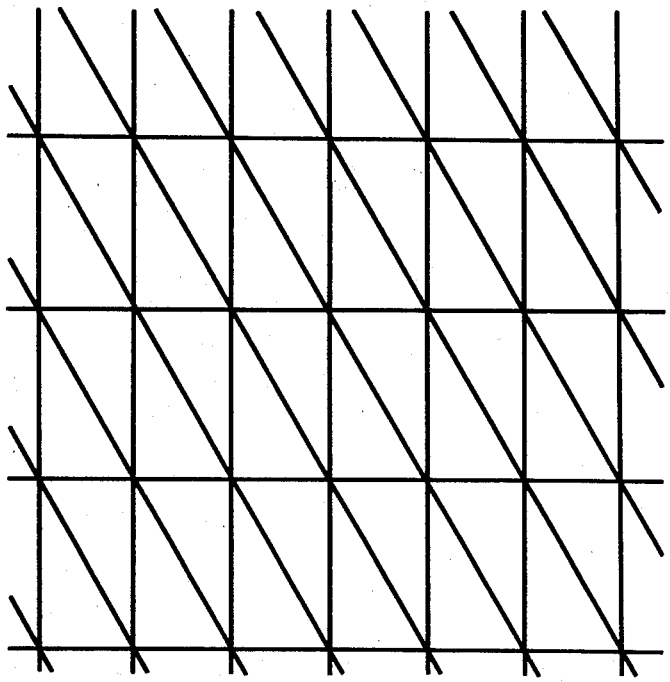
FIG. 9 is an illustration of a pattern in which three sets of a group of straight lines having a number of straight lines aligned parallel to one another and in equally spaced relation are intercrossed orthogonal to one another and diagonally to one another.

FIG. 9 illustrates an example of such a pattern.

As described above, it is possible to obtain a gravure screen of the present invention even by utilizing, similarly to the preceding procedure, the pattern obtained by intercrossing two or three sets of a group of parallel straight lines orthogonal to or diagonally to one another.

However, in the case of a pattern not in the form of a regular quadrilateral like the patterns shown in FIGS. 6 to 9, the distance between the intersections is different, for example, between the lateral and longitudinal directions, and therefore, when the positions of the intersections are irregularly displaced, it is preferable that the irregularity thereof is differentiated from the case of the regular polygon.

For example, in the case of the pattern shown in FIG. 6, all of the spacings between the group of longitudinal straight lines are the distance (X) which are equal to one another, and all of the spacings between the group of lateral straight lines are the distance (Y) which are equal to one another, the value of X being different from that of Y. In such a case, the irregularity for displacing the position of the intersection of the straight lines in the aforesaid pattern in a lateral direction is differentiated from that of a longitudinal direction. That is, the displacements of the positions of the intersections in the lateral and longitudinal directions are respectively limited, for example, within $\pm X/2$ and $\pm Y/2$.

Figure 10:
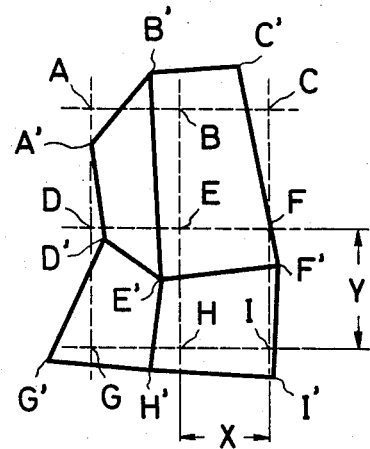
FIG. 10 is a view for explanation of the restriction in the case that the position of each intersection of the pattern shown in FIG. 6 is irregularly displaced.

FIG. 10 illustrates an example in which the amounts of displacement in the lateral and longitudinal directions are respectively limited within $\pm X/2$ and $\pm Y/2$. In this example, numerical values of 0, $\pm 0.2$, $\pm 0.4$, $\pm 0.6$, $\pm 0.8$, and $\pm 1.0$ are provided at random, and the positions of the respective intersections A, B, C, . . . I are displaced by the amount resulting from multiplication of the aforesaid numerical values by X/2 and Y/2 to obtain positions A', B', C', . . . I', which points are joined.

Figure 11:
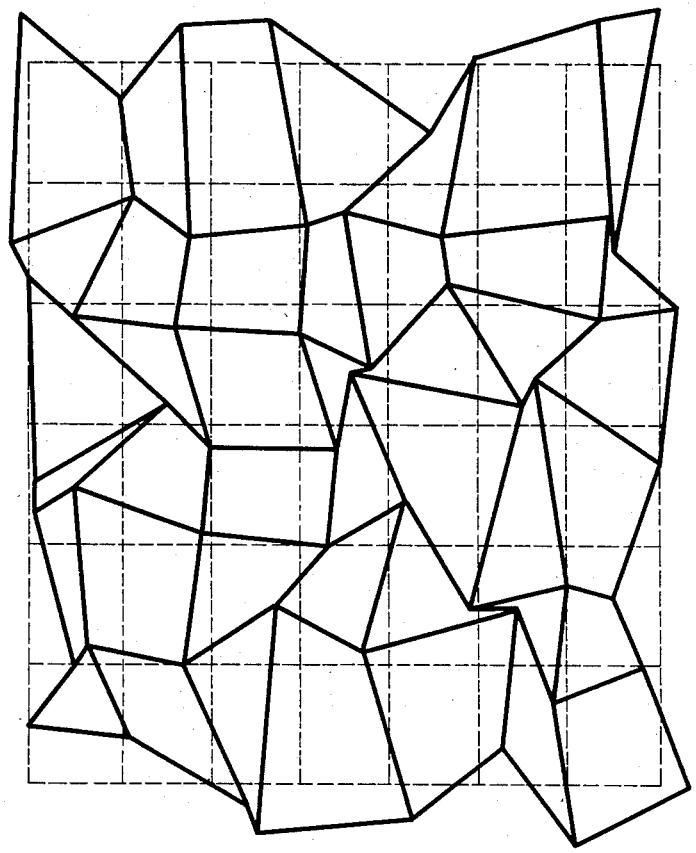
FIG. 11 is an illustration of a modified pattern of the pattern in FIG. 6.

FIG. 11 illustrates an example of a modified pattern of the pattern shown in FIG. 6.

In the case of the pattern shown in FIG. 7, the spacing between the straight lines of the group of straight lines in the longitudinal direction is random, and the spacing between the straight lines of the group of straight lines in the lateral direction is also random. Also in this case, the amount of displacement is established at random within the restriction as in the amount of displacement which is smaller than a half of the spacing between the straight lines to obtain positions after displacement, and the positions after displacement may be joined by the segments of lines.

Figure 12:
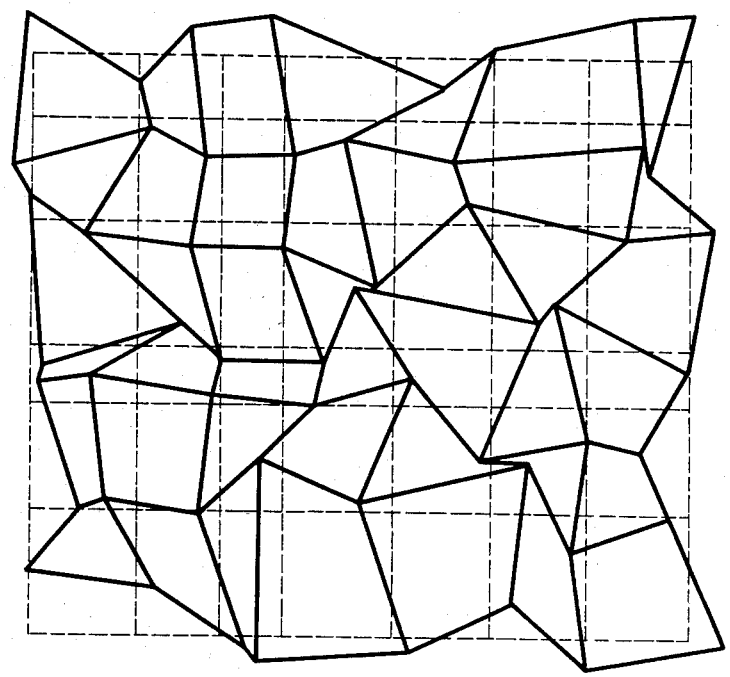
FIG. 12 is an illustration of a modified pattern of the pattern in FIG. 7.

FIG. 12 illustrates an example of a pattern in which the positions of the respective intersections are displaced.

Figure 13:
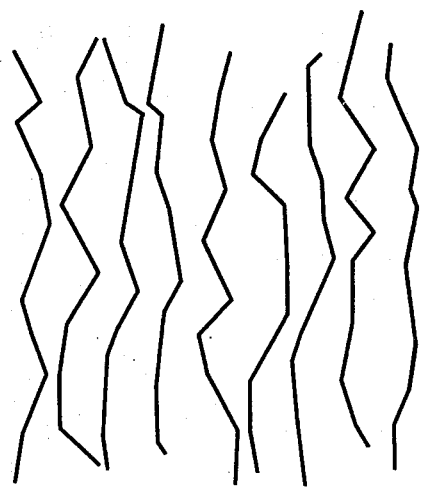
FIG. 13 is an illustration of a pattern in which the positions of intersections of the regular quadrilateral repetitive patterns are irregularly displaced, after which only lines corresponding to longitudinal lines of the regular quadrilateral are joined.
Figure 14:
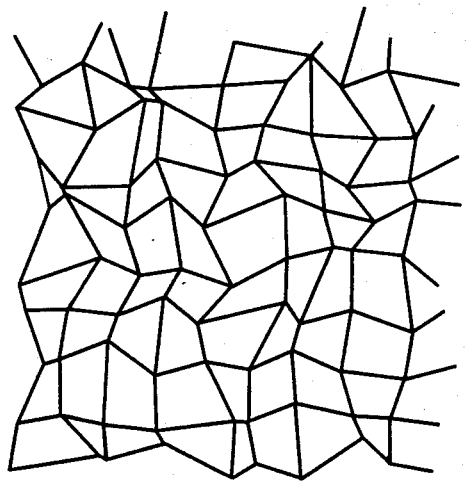
FIG. 14 is an illustration of a pattern in which dots irregularly displaced which have been used to form the FIG. 13 pattern are longitudinally and laterally joined.

While in the foregoing, the joining relation of the positions prior to displacement of the respective points is concerned with the case where the joining relation is established with respect to all the segments of lines passing through the respective points prior to displacement thereof, it should be noted alternatively that such a relation may be established to only one group of straight lines of those passing through the respective intersections. In this case, in the pattern obtained by joining the points after displacement thereof, there occurs no intersection between the segments of lines. FIG. 13 illustrates an example of such a pattern as described above. In FIG. 13, the positions of the intersections in the repetitive patterns of regular quadrilaterals are irregularly displaced as previously described, after which only the lines corresponding to those in the longitudinal direction of the regular quadrilateral are joined. It is noted that FIG. 14 shows, for reference, a pattern in which lines corresponding to not only the longitudinal direction but both longitudinal and lateral directions are joined.

It is generally said that for the gravure printing, cells in the shape of a regular quadrilateral, a rectangle, a hexagon, a semi-circle, etc. need be formed. However, in the case of the gravure screen of the present invention having the pattern as shown in FIG. 13, a complete cell as described above is not formed, but a printed matter which produces no flow of ink may be obtained.

In the case of the gravure screen of the present invention in which the irregularly bended segments of lines are aligned in one direction, and actually, for example, in the case of the positive type and if the thickness of the transparent lines is taken into consideration, the mode wherein longitudinal lines are close to each other, come into contact with each other or spaced apart from each other is irregularly repeated. FIG. 15 is a view for explanation of the state of the actual gravure screen based on the pattern shown in FIG. 13.

In the case that such a gravure screen as described above is used to make a gravure plate, even if the density of the positive is the same, an etching solution is hard to enter, at the time of etching, into a portion in which the transparent lines are close to each other, as a consequence of which the etching depth in that portion becomes shallowed. Further, a portion in which transparent lines come into contact with each other is not etched. Thus, the portion in which the transparent lines are close to or come into contact with each other is etched shallowly as compared to that greatly away from the transparent line or not etched at all. Accordingly, the ink is hard to flow in that portion or the flow of ink is prevented. In this manner, according to the gravure screen of the present invention, even by the presence of only the longitudinal transparent lines as shown in FIG. 15, a printed matter without flow of ink may be obtained.

In the embodiments of the present invention as described above, the positions of the intersections in the polygonal pattern are displaced to thereby prepare an original pattern for the gravure screen.

In the alternative embodiment of the present invention, a gravure screen is prepared in the following manner, as already described above. That is, this embodiment comprises setting a predetermined starting line vector, producing a number of movable vectors which are irregularly varied in their length and direction within a predetermined range with respect to said starting line vector, recording a terminal point of said starting line vector as positional information of a first point, using the terminal point of said starting line vector as a starting point of a first movable vector, recording a terminal point of the first movable vector as positional information after displacement of the first point, recording said point as positional information of a second point, using the terminal point of the first movable vector as a starting point of a second movable vector, recording a terminal point of the second movable vector as positional information after displacement of the second point and recording the same as positional information of a third point, recording positional information of a plurality of points prior to movement and positional information after displacement of the plurality of points in a similar manner, joining the positions after displacement of the plurality of points by straight lines or curved lines in accordance with said order to prepare segments of lines, and longitudinally and/or laterally arranging the thus prepared number of segments of lines so that said starting line vector is spaced apart as required to use it as an original pattern of the gravure screen, thus obtaining a gravure screen.

Next, such an embodiment will be more specifically described with reference to the drawings.

To obtain a gravure screen of the present invention, it is necessary to prepare an original pattern thereof. The original pattern may be obtained in the following manner. First, a predetermined starting line vector (4) as shown in FIG. 16 is set. Movable vectors which are irregularly varied in their length and direction within a predetermined range with respect to the starting line vector (4) are produced.

Figure 18:
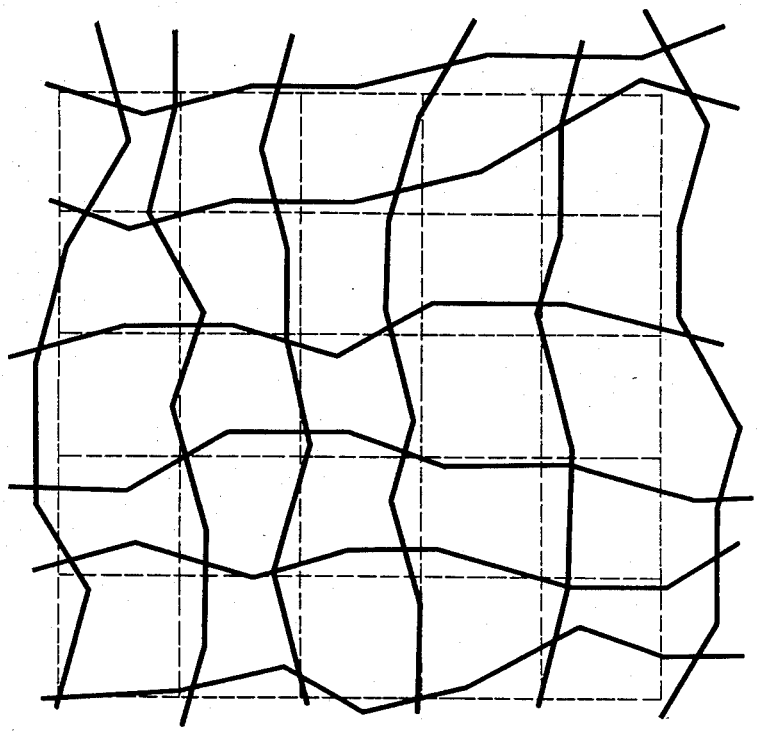
FIG. 18 is an illustration of an example of an original pattern used for the gravure screen formed by the pattern of a segment of a line bended irregularly with a number of movable vectors made to continue.
Figure 19:
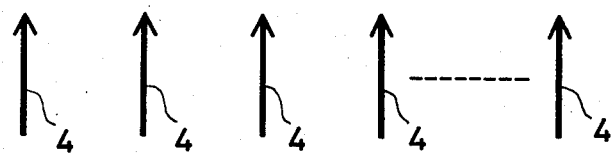
FIG. 19 is a view for explanation of the state in which a numbr of starting line vectors are aligned in a predetermined spaced relation.

A number of the thus produced movable vectors are connected to thereby form a pattern of irregularly bended segments of lines. FIG. 17 illustrates a pattern (5) of segments of lines thus obtained. Next, a number of patterns (5) of segments of lines are longitudinally and laterally arranged so that starting line vectors are in a predetermined spaced relation to thereby form a crossed pattern in which said patterns (5) of segments of lines are intercrossed. FIG. 18 illustrates an example of the thus obtained crossed pattern. In FIG. 18, patterns indicated by the dotted lines orthogonal to one another designate the orthogonal patterns of the conventional gravure screen. A number of patterns of segments of lines may be longitudinally and laterally arranged so that starting line vectors are in a predetermined spaced relation by the steps, for example, as shown in FIG. 19, pre-aligning a number of starting line vectors (4) in a predetermined spaced relation, producing movable vectors with respect to the respective starting line vectors (4) to form a number of patterns (5) of segments of lines as shown in FIG. 20, preparing two sets of alignments of the thus obtained patterns of segments of lines, and intercrossing said alignments so that the starting line vectors are intercrossed orthogonal to each other to prepare an intercrossed pattern.

Alternatively, a number of patterns (5) of segments of lines may be independently prepared and arranged longitudinally and laterally so that the starting line vectors are in a predetermined spaced relation to form an intercrossed pattern.

Figure 20:
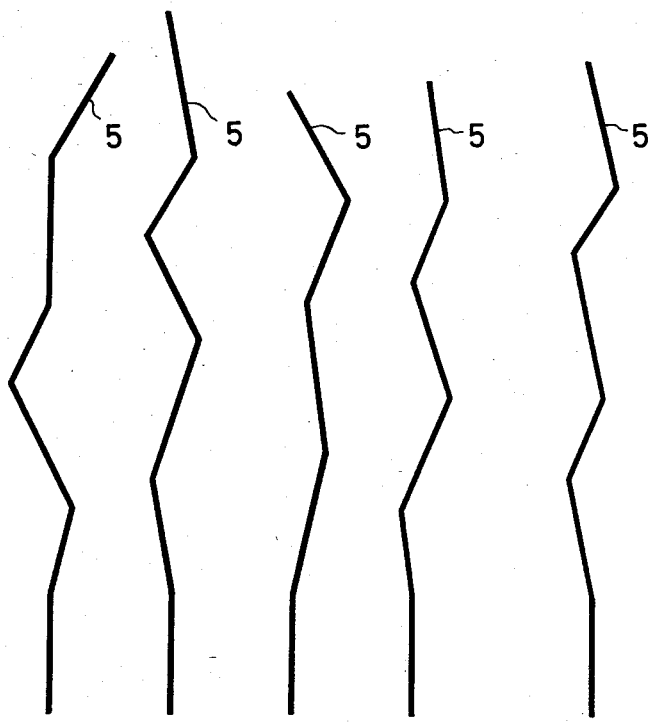
FIG. 20 is a view for explanation of the alignment of a number of patterns of segments of lines irregularly bended with a number of movable vectors made to continue.

If only one set of patterns of segments of lines shown in FIG. 20 is used, a pattern similar to the pattern shown in FIG. 13 can be obtained, which can also be used as an original pattern for the gravure screen.

The pattern (5) of segments of lines is irregularly bended. The length in which the pattern (5) of segments of lines is bended is irregular within a predetermined range, and the direction in which the pattern is bended is also irregular within a predetermined range. The irregularities in length and direction in which the pattern (5) of segments of lines is bended are desired to be within a predetermined range. To this end, means may be employed to control the movable vectors by the probability variant wherein for example, if the average size of the cell is $100\mu$, the average length is $100\mu$, and the gauss distribution at which standard deviation is $20\mu$ is obtained, and if the starting line vector is directed at 0°, the average angle is 0° and the gauss distribution at which standard deviation is 20° is obtained.

It should of course be understood that numerical values are not limited to those as described above but various values may be employed.

Furthermore, another means may be employed. For example, the movable vectors may be produced with respect to the starting line vector, to form a pattern of segments of lines, by use of the probability variant which is $r = 1 \cos \theta$, $\theta = (0, \pm15°, \pm30°)$, where l is the constant (for example, the length of one side of the cell in the conventional section-screen), r is the length of the movable vector, and $\theta$ is the angle of the movable vector to the starting line vector in which if any of 0°, $\pm15°$, or $\pm30°$ is appeared, the opposite mark are taken. In this case, the irregularity in area of the cell may be further decreased.

In the present invention, it is preferable in terms of efficiency that the pattern of segments of lines or the intercrossed pattern is formed by utilization of an electronic computer, but it is also possible to manually prepare an enlarged pattern and reduce the same.

In the present invention, after the pattern of segments of lines or the intercrossed pattern has been prepared, the intercrossed pattern is used as an original pattern of transparent or opaque lines for the gravure screen.

Various means may be used to obtain the gravure screen by making use of the original pattern.

For example, an electronic computer is used to compute the intercrossed patterns in a manner as previously mentioned, a transparent glass plate or the like subjected to necessary process is scribed under the control of an automatic engraving machine or the like using data resulting from said computation, and a gravure screen is prepared in the conventional method.

Further, the patterns of segments of lines as shown in FIG. 20 are computed by utilization of the electronic computer or the like, and the exposure device is controlled to output-form them on the photosensitive film. Alternatively, two sheets of such patterns are prepared, and these two patterns are superposed so that they are intercrossed to prepare an intercrossed pattern, which is further printed on another photosensitive film to form a gravure screen.

In another alternative form, the intercrossed patterns are output-formed on the photosensitive film by use of the electronic computer or the like to form a gravure screen.

Alternately, the patterns of segments of lines or the intercrossed patterns are output-formed by use of drafting equipment or the like making use of an electronic computer, and said patterns are formed on a transparent film or a glass plate by means of a photographic procedure or other means to provide the gravure screen as previously described.

While in the present invention, an original pattern may be prepared to have the same dimension as that of a final product, it should be understood that in consideration of the width of lines, accuracy or the like, an original pattern may be enlarged to some extent, after which the pattern may be reduced and photographed and then subjected to multiple exposure by use of the multi-step or the like to provide a gravure screen of the size as required. In this case, it must be set so that the coordinate Y of the pattern of segments of lines in the direction X of a portion as a joint and the coordinate X of the pattern of segments of lines in the direction Y may assume a given value.

In the gravure screen of the present invention, if it is designed so that a portion of the intercrossed pattern is transparent, the positive type may be obtained, whereas if it is opaque, the negative type may be obtained. Whichever gravure screen may be suitably selected as necessary, which has already been described above.

The gravure screen of the present invention may be obtained as described above. The area of the cell portion of the thus obtained gravure screen is irregularly varied within a predetermined range. This range in which the area is irregularly varied is difficult to be described directly since it depends on the fact that the length in which the pattern of segments of lines is bended and the angle thereof is varied within a predetermined range.

In the gravure screens in various embodiments of the present invention previously described, the transparent or opaque lines are irregularly varied, and thus the moire pattern is not formed, and since the area of the cell portion is within a certain range, the gravure screen of the invention has less unevenness and roughness as compared with the sand-grained screen.

While in the foregoing explanations, the segments of lines which join the points after displacement were mainly the straight lines, it should be noted that curved lines may be used in place of the straight lines, and particularly, smooth curved lines may also be used. Alternatively, after the points posterior to displacement have been joined by the straight lines, the segments of lines obtained by the joining of the straight lines may be approximated by the smooth curved line. Preferably, the curved lines to be approximated are ones as close to the original segments of lines as possible. The high degree formula such as the curve of secondary degree may be used for such approximation. The curved lines to be approximated may be formed while being limited so that they may pass through the positions of the points after displacement, or such a limitation may not be provided. Further, the straight lines and the curved lines may be combined.

As described above, when the original pattern is formed by smooth curved lines in order to obtain the gravure screen, the degree of the irregularity and roughness is further decreased as compared with the sand-grained screen. The reason is that in the gravure screen composed of the irregularly bended straight lines in which the points after displacement are joined by the straight lines, the respective segments of lines are sometimes intercrossed at an acute angle as can be understood, for example, from FIGS. 4, 5, 11, 12, 14 and 18, and the cell in that portion is difficult to be etched when the gravure plate is etched, as a consequence of which the cell in that portion is not formed with a sufficient depth and thus the ink is difficult to be transferred onto a material to be printed when printing is carried out, whereas in the case of the smooth curved lines, the trend as described can be relieved. In accordance with the present invention, the gravure screen having the irregular pattern is obtained, but this gravure screen does not suffer from a moire pattern even if the gravure screen is used together with a planographic or relief half-tone positive to make a gravure printing plate, and in addition, there occurs less roughness than the sand-grained screen.

The gravure screen in accordance with the present invention has less roughness than the sand-grained screen, but in case of using the pattern composed of the smooth curved lines, the roughness thereof can be reduced as already described above. In this connection, the degree of the roughness may be reduced even by other methods.

In the following, the gravure screen with the roughness reduced which can obtain more preferable results in the present invention will be described.

Figure 21:
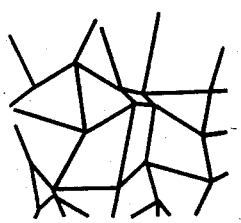
FIG. 21 is an illustration of an example of an original pattern for the gravure screen in accordance with the present invention.
Figure 22:
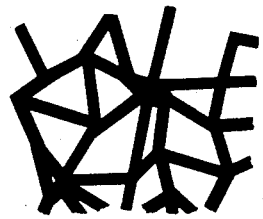
FIG. 22 is an illustration of an example in which when the pattern of FIG. 21 is the gravure screen, a small cell portion is eliminated or an extremely small cell results.

In the case of the gravure screen composed of irregularly shaped patterns as in the present invention, the area of the cell portion surrounded by the segments of the transparent or opaque lines is different and uneven depending on each of the cells. In this case, in the actual gravure screen, the cell portion having a small area in the original pattern sometimes is eliminated or is extremely reduced in area. FIG. 21 illustrates an example of the original pattern for the gravure screen in accordance with the present invention, and FIG. 22 is a view for explanation of an example in which where the pattern of FIG. 21 is formed into the gravure screen, the small cell portion is eliminated or is formed into an extremely small cell. As may be understood from FIGS. 21 and 22, if the area of the cell portion in the original pattern is small, the gravure plate in that said portion is sometimes not at all formed with a cell, the ink is not at all transferred onto a material to be printed or the cell is so small that the sufficient cell depth is not obtained and that the ink is not sufficiently transferred onto the material to be printed. Accordingly, this can be caused to feel rough.

To reduce such a roughness, such an object may be readily achieved by sacrificing the irregularity of the points to be displaced to some extent, but this tends to form the moire. Conversely, if an attempt is made to sufficiently provide the irregularity, it is difficult to uniform the areas of the cells, and the roughness tends to occur.

Figure 23:
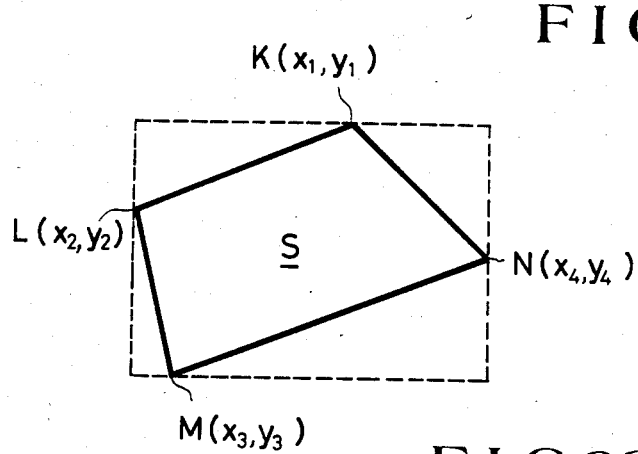
FIG. 23 is a view for explanation for calculating an area of an irregular quadrilateral.

In such cases, in the present invention, various means which will be described hereinafter may be employed to reduce the inconveniences as noted above. As an example for such means, the case of the deformed quadrilateral pattern as shown in FIG. 5 obtained by deforming the quadrilateral pattern as shown in FIG. 1 will be described in detail. That is, in this case, after the deformed quadrilateral patterns have been formed as previously mentioned, the area of each of the deformed quadrilaterals is obtained. The area of this deformed quadrilateral may be obtained in a suitable manner. For example, in the case of a deformed quadrilateral KLMN as shown in FIG. 23, let $K(x_1, y_1)$, $L(x_2, y_2)$, $M(x_3, y_3)$ and $N(x_4, y_4)$ represent the respective coordinates, the area S is given by the following calculation formula:

$$S = \{\max(x_1, x_2, x_3, x_4) - \min(x_1, x_2, x_3, x_4)\} \cdot$$
$$\{\max(y_1, y_2, y_3, y_4) - \min(y_1, y_3, y_3, y_4)\} -$$
$$\tfrac{1}{2} \{|x_1 - x_4| \cdot |y_1 - y_4| + |x_2 - x_1| \cdot |y_2 - y_1| +$$
$$|x_3 - x_2| \cdot |y_3 - y_2| + |x_4 - x_3| \cdot |y_4 - y_2|\}$$

If the thus calculated area of the irregular polygon exceeds a predetermined range, for example, if said area is larger than or smaller than the predetermined range with respect to the area of the original regular polygon, the irregular polygon is subjected to divisional or combinational processing. These divisional processing and combinational processing respectively mean the work for connecting the apexes not adjacent to each other of said irregular polygon and the work for eliminating one side of said irregular polygon. However, the selection of the apexes and selection of the side must be performed under the condition that an area of a new irregular polygon formed after the performance of said work does not exceed the predetermined range.

Figure 24:
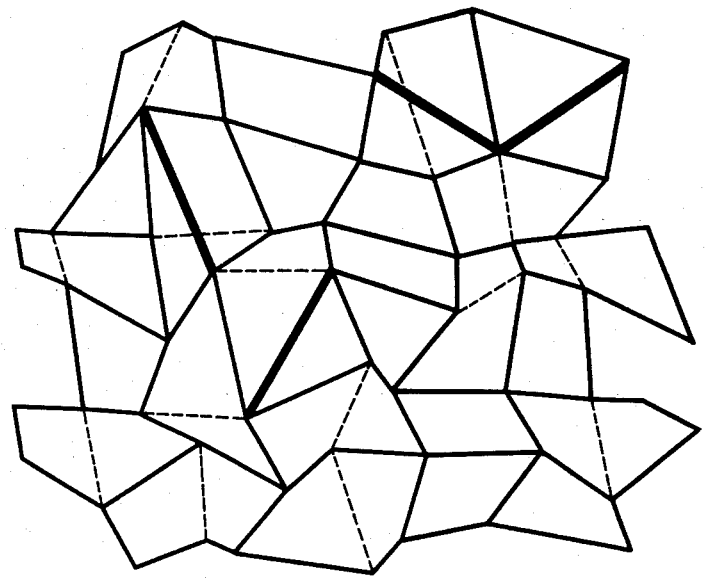
FIG. 24 is a view for explanation of the state in which the group of irregularly deformed quadrilaterals are restricted in area.

FIG. 24 is a view for explanation of the state in which a limitation in area is placed on the group of irregular deformed quadrilaterals of FIG. 5, the segments of lines depicted by the dotted lines designating the segments of lines to be eliminated by the combinational processing, and the segments of lines depicted by the thick lines designating the segments of lines to be newly connected by the divisional processing.

Figure 25:
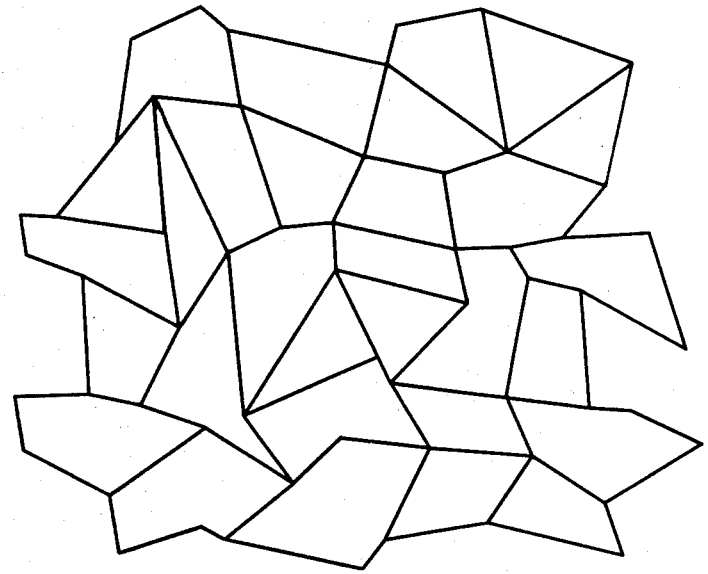
FIG. 25 is an illustration of a pattern in which the area in FIG. 24 is restricted.

FIG. 25 illustrates a pattern on which the work for placing the limitation in area has been placed, in which case there shows a group of irregular polygons having an area from 90 to 300% of the area of the original regular quadrilateral.

If the original regular quadrilateral is merely deformed, all of them assume the quadrilateral patterns even after being deformed, as is evident from FIG. 5. That is, the number of angles of the original polygon is the same as that of the deformed polygon. This also applies to the case of triangular and hexagonal patterns.

On the other hand, the deformed patterns after the limitation in area has been placed include the polygons having various number of angles as is evident from FIG. 25. The polygons having various number of angles are entirely irregular in their shape, and the area of the polygon is within a predetermined range.

Figure 26:
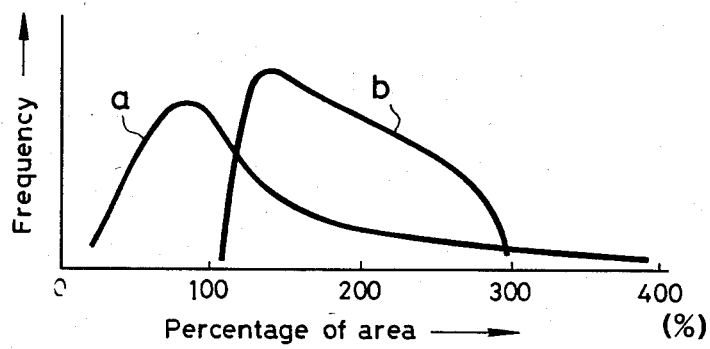
FIG. 26 is an illustration of a graphic representation showing the distribution state of irregular polygonal areas shown in FIG. 5 and the distribution state of the irregular polygonal areas to which area restriction is made shown in FIG. 25.

FIG. 26 is a graphic representation showing the distribution state (the curve a in the graph) of the area of the irregular polygon shown in FIG. 5 and the distribution state (the curve b in the graph) of the area of the irregular polygon on which limitation in area is placed shown in FIG. 25. It is found also from FIG. 26 that the irregular polygonal pattern shown in FIG. 25 which limitation in area is placed is reduced to feel rough.

Also, in the irregular polygons on which limitation in area is placed in accordance with the present method, their iregularity is enhanced as can been seen also from FIG. 25. This results from the fact that as shown in FIG. 24, the segments of lines shown by the dotted lines are removed whereby the segments of continuous lines are divided and the polygons different in the number of angles are created for coexistence.

To prepare a deformed polygonal pattern on which limitation in area is placed as described above, it is preferable to prepare the pattern by making use of an electronic computer in terms of efficiency, but it is also possible to manually prepare an enlarged pattern and reduce the same.

In the present invention, the deformed polygonal pattern obtained by placing a limitation in area thereon as described above is used as the original pattern having the segments of transparent or opaque lines for the gravure screen.

In the gravure screen of the present invention obtained as described above, the points in the opaque or transparent cell portions include the polygons having the different number of angles, and the lengths of the segments of transparent or opaque lines forming the polygon are irregularly varied within a predetermined range.

Further, the areas of the cell portions of the gravure screen in accordance with the present invention obtained as described above are irregularly varied within a predetermined range.

The cell portion within the predetermined area as described above of the gravure screen is not limited to be started from the quadrilateral cell shape but the triangular cell may also be used, which can be prepared in a manner similar to the case of the quadrilateral cell shape. In addition, by using the hexagonal cell shape the gravure screen can be likewise manufactured.

The gravure screen of the present invention obtained as described above has its segments of transparent or opaque lines varied irregularly, and therefore, no moire pattern forms, and in addition, since the area of the cell portion is within a certain range, the gravure screen of the present invention has the effect that the unevenness and roughness are further decreased as compared with the sand-grained screen.

Moreover, by application of the means as described above, the gravure screen having a smaller coefficient of fluctuation in area of cell may be obtained as compared with one which uses the pattern as shown in FIG. 5 in which positions of the intersections of the regular polygon are merely varied, there offers the effects that the transferability of ink in the cell formed on the gravure cylinder is enhanced as compared with the gravure screen obtained by the pattern as shown in FIG. 5 and that a feeling of roughness as in the sand-grained screen is solved.

Further, in accordance with the present invention, as compared with the gravure screen obtained by making use of the pattern shown in FIG. 5, the gravure screen with the irregularity of pattern enhanced can be obtained and the gravure screen with less feeling of roughness can be obtained to further increase the moire preventive effect and to make a contribution to provide printed matter with less feeling of roughness.

Figure 27:
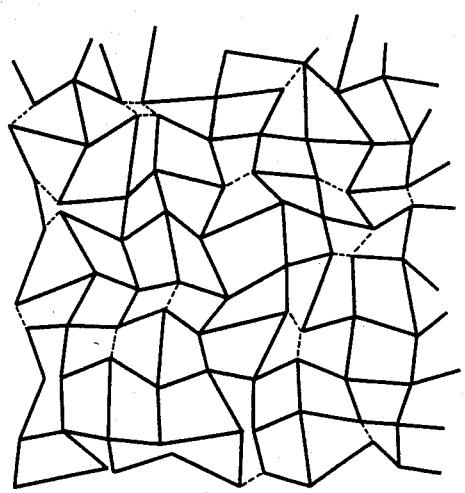
FIG. 27 is an illustration in which in the pattern shown in FIG. 4 those portions where the lengths of the segments of lines between the respective intersections are shorter than the determined length are indicated by the dotted lines.

In the foregoing description, the processing is applied in which the area of the cells in the deformed pattern is calculated so that the area of the cells is within a predetermined range to thereby decrease the roughness of the irregular pattern. According to another embodiment, in the case that a number of segments of lines formed by joining the points after displacement are intercrossed to provide intersections, the length of a segment of a line adapted to join the intersections is limited within a predetermined range to decrease the roughness. That is, the length of a segment of a line adapted to join the intersections, and if the length of a segment of a line is shorter than a predetermined length, such a segment of a line is eliminated to thereby decrease the roughness. FIG. 27 illustrates a pattern in which in the pattern shown in FIG. 14, those of which the length of a segment of a line between the intersections is shorter than the predetermined length are indicated by the dotted lines, which are the segments of lines to be eliminated. As can be seen from the pattern of FIG. 27, the segments of short lines are often appeared in the case that relatively small cell portions are formed or in the case that elongated cell portions are formed. In the gravure screen formed on the basis of the pattern having the cell portions as described above, the aforesaid cell portions become eliminated or extremely narrow cells result, as can be understood from FIGS. 21 and 22. Thus, in the gravure plate, that portion is not at all etched or is hard to be etched, which is caused to lower the transfer of ink to a material to be printed and to cause the roughness, as previously mentioned. It is understood from FIG. 27 that the segments of lines indicated by the dotted lines may be eliminated to thereby reduce the cause of the aforesaid roughness.

According to still another embodiment, in the case that a number of segments of lines formed by joining the positions after displacement have the intersections, said segments of lines are eliminated by a predetermined length from each of the intersections to thereby decrease the roughness.

Figure 28:
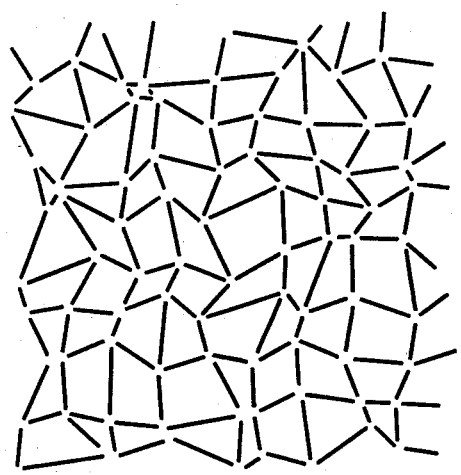
FIG. 28 is an illustration of a pattern in which the segments of lines shown in FIG. 14 are provided with cutaway portions.

FIG. 28 illustrates an example of a pattern formed as described above, in which in the pattern shown in FIG. 14, the segments of lines extended radially about each of the intersections of the segments of lines are deleted by a predetermined length. Preferably, the length to be eliminated is about 1/5 to ½ of the distance between the points prior to displacement. The predetermined length to be eliminated may be one which is irregularly varied.

As another embodiment in which each of the segments of lines is eliminated by a predetermined length to form a cutaway portion, for example, a pattern formed by the movable vectors as described previously is shown in FIG. 29.

Figure 29:
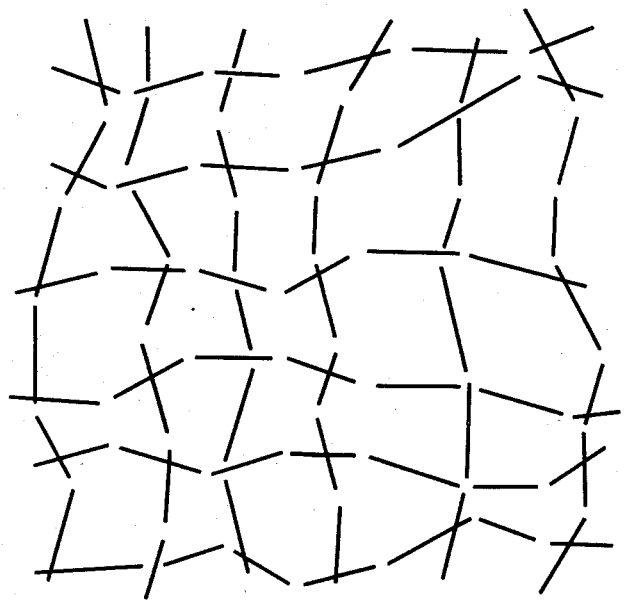
FIG. 29 is an illustration of a pattern in which the segments of lines shown in FIG. 18 are provided with cutaway portions.

While in the embodiment shown in FIG. 29, the cutaway portions of the predetermined length are provided at the starting point and at the terminal point of each movable vector, it should be noted that in addition to or separately therefrom, a cutaway portion having a predetermined length may be provided in each segment of a line about each intersection in the portion where the segments of lines are intercrossed.

Figure 30:
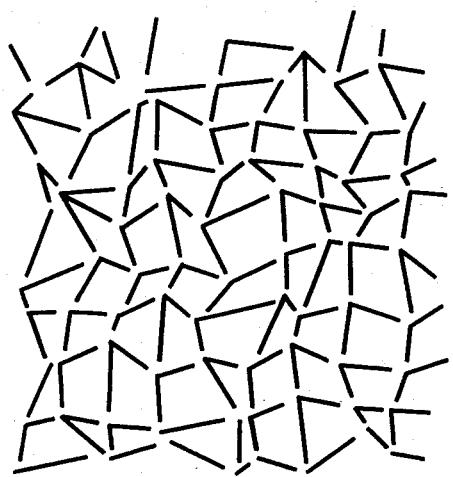
FIGS. 30 to 32 illustrate further examples of patterns in which the segments of lines shown in FIG. 14 are provided with cutaway portions.

While in the embodiment shown in FIG. 28, cutaway portions are provided at both ends of the segments of short lines joining the intersections, it should be noted that a cutaway portion may be provided at one end instead of both ends. FIG. 30 illustrates an example in which a cutaway portion is provided only at one end of the segment of a short line between the intersections of the pattern shown in FIG. 14.

As an alternative embodiment in which a cutaway portion is provided in each of the segment of a line, in the case that a number of segments of lines formed by joining positions of the points after displacement have intersections, cutaway portions are not provided in all of the segments of lines about each of said intersections but may be provided only in some of the segments of lines.

That is, the cutaway portion is provided in the segment of a line for the purpose of decreasing the roughness, and thus the cutaway portion can be selectively provided in a portion which is liable to produce the roughness.

The roughness is liable to occur in the cases that an area of the cell portion surrounded by the segments of lines forming a pattern of the gravure screen is small, that an angle at which said segments of lines are intercrossed is the acute angle, or that the distance between the intersections of said segments of lines is short, and the cutaway portion may be selectively provided in that portion as described to decrease the roughness.

In this case, an area of each cell portion is calculated, an angle between the segments of lines at the intersections is calculated or the length of the segment of a line between the intersections is calculated, and only in the case the values obtained by such calculations are respectively smaller than those of a predetermined area, a predetermined angle or a predetermined length, a cutaway portion is provided in each segment of a line.

Preferably, the segment of a line in which a cutaway portion is provided is selected depending on which the shortest segment of a line among those passing through the intersections is, which the second shortest segment is, or the shape of the pattern.

The roughness of the gravure screen may be decreased by various methods as described above and can be also decreased by a combination of said various methods. For example, a cutaway portion may be provided in the pattern in which cell portions are subjected to the combinational or divisional processing so that the area of the cell portions is within a predetermined range, and in case that an angle formed between the segments of lines at the intersections is smaller than a predetermined angle, a cutaway portion may be provided in that segment of a line.

Figure 31:
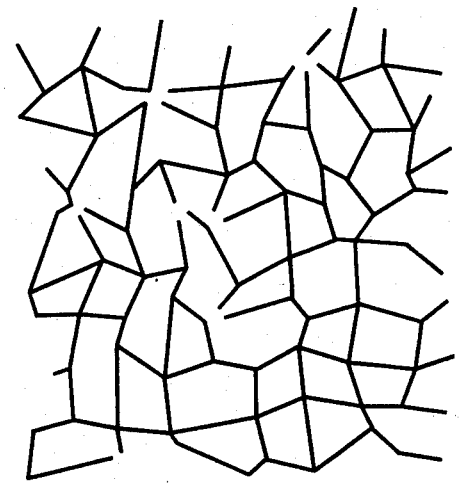
Figure 32:
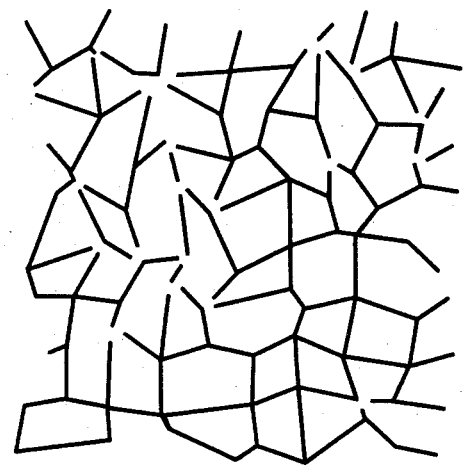

FIGS. 31 and 32 illustrate examples in which such a processing has been applied, FIG. 31 being the case in which said predetermined angle is set to 45°, and FIG. 32 being the case of 60°.

If the processing for decreasing the roughness is applied as described above, not only the roughness is decreased but the center of gravity of each cell is moved in position to increase the irregularity of the pattern and further decrease the formation of moire patterns.

Figure 33:
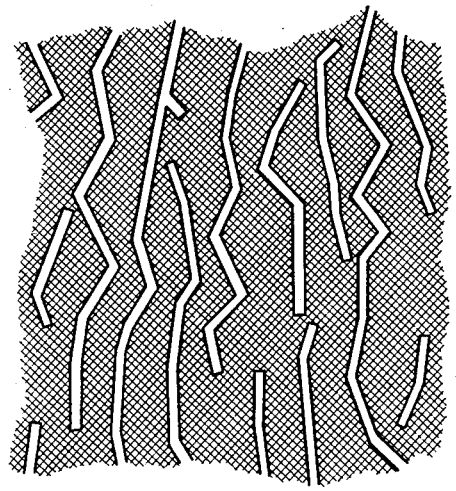
FIG. 33 is an illustration of a pattern of the gravure screen based on a pattern wherein in the pattern of FIG. 14 only the segments of lines corresponding to the group of longitudinal straight lines likewise FIG. 13 are joined to one in which cell portions are subjected to combination process so that the area of the cell portion is within a predetermined range.

Moreover, the pattern subjected to the processing for decreasing the roughness may also be a pattern as shown in FIG. 33 which is a combination of the method for placing the joining relation of a plurality of points after displacement in correspondence to only the predetermined group of straight lines and the method for brining the area of the cell portion into the predetermined range.

FIG. 33 illustrates a pattern of the gravure screen on the basis of the pattern in which only the segments of lines corresponding to the group of longitudinal straight lines similarly to FIG. 13 are joined to those in which the cell portions are combined with the pattern shown in FIG. 14 so that the area of the cell portion is within the predetermined range. In such a gravure screen, the degree of formation of moire patterns is further decreased and the degree of influence of roughness on the printed matter is also decreased as compared with the gravure screen shown in FIG. 15.

As described above, in accordance with the present invention, the gravure screen having an irregular pattern can be obtained, and even if this screen is combined with the planographic or relief half-tone positive to make a gravure printing plate, the moire is not formed. Further, according to the preferred embodiment of the present invention, even the gravure screen having an irregular pattern can decrease the roughness of the printed matter.

The irregular pattern used for the gravure screen is further increased in its irregularity by carrying out the following processing. That is, firstly, each of the segments of lines is divided by the suitably determined coefficient into two, three, four sections, etc. Secondly, a cutaway portion is provided in a certain length of the segment of a line irrespectively of intersections between the segments of lines or branched points, or a cutaway portion is provided in a random length of the segment of a line. Thirdly, each of the segments of lines is divided by the coefficient at random. Alternatively, a number of segments of lines formed by joining the positions of points after displacement are divided in the desired length and in the desired number, and the thus divided segments of lines having the desired length are irregularly rotated at the desired angle to formed a pattern and to use it as an original pattern for the gravure screen.

Figure 34:
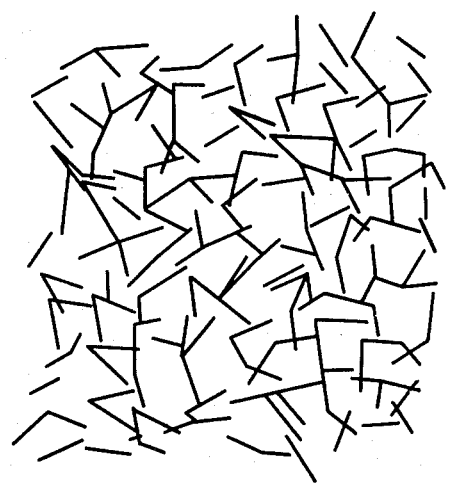
FIG. 34 is an illustration of a pattern in which the segments shown in FIG. 14 are divided, each of the divided segments of lines being irregularly rotated.

FIG. 34 illustrates an example of a pattern obtained by subjecting the pattern shown in FIG. 14 to the aforesaid processing. In the pattern of FIG. 34, the length of the segment of a line between the intersections of the segments of lines shown in FIG. 14 is calculated, and the segments of lines shorter than a predetermined length are not divided, but those exceeding a predetermined length are divided in length into two sections, and the segment of a line divided into two sections is rotated through irregularly employed values 0°, ±10°, ±20°, ±30° and ±40° with one end thereof as a point.

The gravure screen prepared on the basis of the thus formed pattern has fine irregular segments of lines intercrossed or placed in contact with one another as if the fine segments of lines to prevent the flowing of ink are scattered in a large cell, thus increasing the irregularity without the formation of moire patterns.

According to a further method, there is prepared a pattern in which intersections composed of a group of regular polygons or parallel lines are irregularly moved while suitably placing a limitation thereon as previously explained, and segments of lines having the irregular length passing through the dots after movement and suitably placing a limitation thereon are arranged at irregular angles to use it as an original pattern for the gravure screen.

As described above, the present invention provides a gravure screen having an irregular pattern and a new method for making such a gravure screen.

The gravure screen of the present invention is especially advantageous in preparation of a gravure printing plate using a planographic or relief half-tone positive, and a moire pattern does not occur between the screen and the half-tone positive or is so minor as to be imperceptible.

Moreover, the gravure screen in accordance with the present invention can also be used in the conventional gravure process, and even if a design having a regular pattern is present in the original, no moire pattern formation occurs between the design and the gravure screen.

What is claimed is:

1. A method for preparing an irregular pattern of transparent or opaque lines for a gravure screen, said method comprising the steps of recording positional information concerning a plurality of points having regular positional relationships such as the points of intersection of a plurality of parallel straight vectors crossing at right angles or in an oblique manner so as to form a regular pattern; calculating, from the respective positions of said plurality of points, positions of new points which correspond to said plurality of points and which are irregularly located within a defined range; recording the positional information of said new points; determining combinations of said new points which correspond to combinations obtained by connecting said plurality of points to one another; connecting said new points to one another with straight or curved lines on the basis of said determined combinations in order to form said irregular pattern, said irregular pattern including a plurality of figures, each of which is surrounded by a number of said straight or curved lines; calculating the area of each of said figures; judging whether or not said area of each of said figures is within a predetermined area range; cancelling each combination of said new points which corresponds to at least one of said straight or curved lines surrounding a particular figure so as to combine said figure with another figure if said area of said figure is smaller than said predetermined area range; determining a further combination of said new points which corresponds to a straight or curved line which divides a particular figure into two smaller figures if said area of said figure is larger than said predetermined area range; and connecting said new points to one another with straight or curved lines in order to reform said irregular pattern.

2. A method for preparing an irregular pattern for a gravure screen according to claim 1, further comprising the step of eliminating all or part of each straight curved line connecting said new points to one another.

3. A method for preparing an irregular pattern for a gravure screen according to claim 1, further comprising the steps of calculating the length of each straight or curved line connecting said new points to one another and cancelling each combination of said new points which defines a particular straight or curved line if the length of said straight or curved line is shorter than a predetermined length.

* * * * *

UNITED STATES PATENT AND TRADEMARK OFFICE
CERTIFICATE OF CORRECTION

PATENT NO. : 4,553,215

DATED : November 12, 1985

INVENTOR(S) : Masuda et al.

It is certified that error appears in the above-identified patent and that said Letters Patent is hereby corrected as shown below:

In the abstract:

Line 20, after "used" add --even--.

In the specification:

Column 1, line 44, after "general" add --,--; after "for" add --the--.

Column 2, line 19 "100 1/inch" should be -- 100 $\ell$/inch--.

Column 3, line 36, "numbr" should be --number--.

Column 5, line 24, after "points" add --,--.

Column 7, line 48, "or" should be --as--.

Column 14, line 57, change "[max($y_1$, $y_2$, $y_2$, $y_4$) - min($y_1$, $y_3$, $y_3$, $y_4$)]" to --[max $y_1$, $y_2$, $y_3$, $y_4$) - min ($y_1$, $y_2$, $y_3$, $y_4$)]--.

Column 15, line 41, after "25", add --on--.

UNITED STATES PATENT AND TRADEMARK OFFICE
CERTIFICATE OF CORRECTION

PATENT NO. : 4,553,215

DATED : November 12, 1985

INVENTOR(S) : Masuda et al.

Page 2 of 2

It is certified that error appears in the above-identified patent and that said Letters Patent is hereby corrected as shown below:

Column 18, line 33, change "brining" to --bringing--.

Column 19, change "30√" to 30°.

Column 20, line 37, after "straight" add --or--.

Signed and Sealed this

Eighteenth Day of November, 1986

*Attest:*

DONALD J. QUIGG

*Attesting Officer*  *Commissioner of Patents and Trademarks*